(12) United States Patent
Hirano et al.

(10) Patent No.: US 6,444,061 B1
(45) Date of Patent: Sep. 3, 2002

(54) PROCESS FOR PRODUCING HEAT-RESISTANT INTERMETALLIC COMPOUND NI₃AL FOIL HAVING ROOM-TEMPERATURE DUCTILITY AND HEAT-RESISTANT INTERMETALLIC COMPOUND NI₃AL FOIL HAVING ROOM-TEMPERATURE DUCTILITY

(75) Inventors: Toshiyuki Hirano; Masahiko Demura, both of Ibaraki (JP)

(73) Assignee: Agency of National Research Institute for Metals, Ibaraki (JP)

(*) Notice: Subject to any disclaimer, the term of this patent is extended or adjusted under 35 U.S.C. 154(b) by 0 days.

(21) Appl. No.: 09/692,543

(22) Filed: Oct. 20, 2000

(30) Foreign Application Priority Data

Oct. 21, 1999 (JP) .......................................... 11-300249

(51) Int. Cl.⁷ ................................................. C22F 1/20
(52) U.S. Cl. ........................ 148/556; 148/562; 148/676
(58) Field of Search ................................ 148/556, 562, 148/676

(56) References Cited

U.S. PATENT DOCUMENTS 4,798,631 A * 1/1989 Fleischer et al. ............ 148/325

FOREIGN PATENT DOCUMENTS

| EP | 1094135 | * 4/2001 |
| JP | 61-210144 | * 9/1986 |
| JP | 03-243733 | * 10/1991 |

* cited by examiner

Primary Examiner—George Wyszomierski
(74) Attorney, Agent, or Firm—Wenderoth, Lind & Ponack, L.L.P.

(57) ABSTRACT

A process for producing a heat-resistant intermetallic compound Ni₃Al foil having a room-temperature ductility, which comprises a first step of arc-melting an alloy having a chemical composition containing Ni as a main component and Al to form a starting rod, a second step of growing the starting rod in columnar crystal form by unidirectional solidification, a third step of cutting out the unidirectionally solidified rod to form a plate, and a fourth step of cold-rolling the plate cut at room temperature to form a foil. The invention can provide a process for producing a thin Ni₃Al foil which has a thickness of 200 microns or less and which is excellent in high-temperature strength, oxidation and corrosion resistances and room-temperature ductility.

7 Claims, 5 Drawing Sheets

→ GROWTH DIRECTION

PROCESS FOR PRODUCING HEAT-RESISTANT INTERMETALLIC COMPOUND NI₃AL FOIL HAVING ROOM-TEMPERATURE DUCTILITY AND HEAT-RESISTANT INTERMETALLIC COMPOUND NI₃AL FOIL HAVING ROOM-TEMPERATURE DUCTILITY

FIELD OF THE INVENTION

The present invention relates to a process for producing a heat-resistant $Ni_3Al$ intermetallic compound having an excellent room-temperature ductility. More specifically, it relates to a process for producing a thin $Ni_3Al$ foil which has a thickness of 200 microns or less and which is excellent in high-temperature strength, oxidation and corrosion resistances, and room-temperature ductility.

DESCRIPTION OF THE RELATED ART

With respect to the improvement of the brittleness of $Ni_3Al$ as a heat-resistant structural material, a method of adding trace boron which was studied in Tohoku University in 1979 is known. In the past, there was an example of forming a plate having a thickness of approximately 500 microns. However, an actual problem that brittleness tends to occur at a high temperature even with the addition of boron still remained unresolved. Further, $Ni_3Al$ containing trace boron was not suited for production of a foil because it had a low room-temperature tensile elongation of approximately 30% and a high yield stress and is consequently low in rolling moldability.

Afterwards, Oak Ridge National Laboratory also studied the improvement of the alloy composition for reducing this material to practical use.

However, in any of the approaches in the past, the problem was to use the material in the form of a plate, a block or a wire, and no attempt was made to use it for production of a foil.

Unlike ordinary metallic materials, the strength of $Ni_3Al$ increases with increasing temperature. At a temperature of 800° C. (or 1,073 K), the strength reaches five times as high as that at room temperature as shown in FIG. 2. For this reason, the material has been considered to be used as a heat-resistant material, in turbine blades, boiler pipes, fuel cladding pipes for a reactor and aerospace materials.

However, conventionally melt and cast $Ni_3Al$ are so brittle as to be broken soon after yielding. Such brittleness in the vicinity of room temperature which is common to intermetallic compounds.

Accordingly, it is difficult to produce a foil having a thickness of 200 microns or less by cold rolling. It has been so far considered quite difficult, and has not yet been realized.

SUMMARY OF THE INVENTION

Under these circumstances, the invention has been made. The objective of the invention is to provide a process in which a thin $Ni_3Al$ foil having a thickness of 200 microns or less can be produced by cold rolling from an $Ni_3Al$ intermetallic compound excellent in high-temperature strength, oxidation and corrosion resistances, and high ductility.

Another objective of the invention is that the foil is applicable to the production of lightweight, heat-resistant structural materials such as a honeycomb structure and a laminated complex material and many other functional materials.

In order to accomplish the foregoing and other objectives, the invention first provides a process for producing a heat-resistant intermetallic compound $Ni_3Al$ foil having a room-temperature ductility, which comprises a first step of forming a stating rod of an alloy having a chemical composition containing Ni as a main component and Al by arc-melting, a second step of growing the starting rod in columnar crystal form by unidirectionally solidified rod to form a plate, and a fourth step of cold-rolling the plate at room temperature to form a foil.

The invention second provides the process for producing the heat-resistant intermetallic compound $Ni_3Al$ foil, wherein the alloy in the first step contains Al in an amount of at least 12.8% by weight and at most 13.6% by weight and has an $L1_2$-type ordered structure. The invention third provides the process for producing the eat-resistant intermetallic compound $Ni_3Al$ foil, wherein the alloy in the first step contains a third element other than Al. The invention fourth provides the process for producing the heat-resistant intermetallic compound $Ni_3Al$ foil, wherein in the first step of rod having a diameter of 50 mm or less is formed as the starting rod. The invention fifth provides the process for producing the heat-resistant intermetallic compound $Ni_3Al$ foil, wherein the rate of unidirectional solidification in the second step is 25 mm/h or less. The invention sixth provides the process for producing the heat-resistant intermetallic compound $Ni_3Al$ foil, wherein in the third step, the thickness of the plate is 5 mm or less. The invention seventh provides the process for producing the heat-resistant intermetallic compound $Ni_3Al$ foil, wherein in the cold-rolling of the plate in the fourth step, annealing is conducted at a temperature of 800° C. (or 1,073 K) or more for 20 minutes or more. The invention eighth provides the process for producing the heat-resistant intermetallic compound $Ni_3Al$ foil, wherein after the fourth step, the work-hardened, cold-rolled foil is annealed with a degree of vacuum of higher than $10^{-3}$ Pa at a temperature of 800° C. (or 1,073 K) or more for 20 minutes or more, and further cold-rolled to form a foil.

Moreover, the invention ninth provides a heat-resistant intermetallic compound $Ni_3Al$ foil having a room-temperature ductility which foil has a chemical composition containing Ni as a main component and Al in an amount of at least 12.8% by weight and at most 13.6% by weight, and has a thickness of 200 microns or less.

BEST MODE FOR CARRYING OUT THE INVENTION

Figure 1:
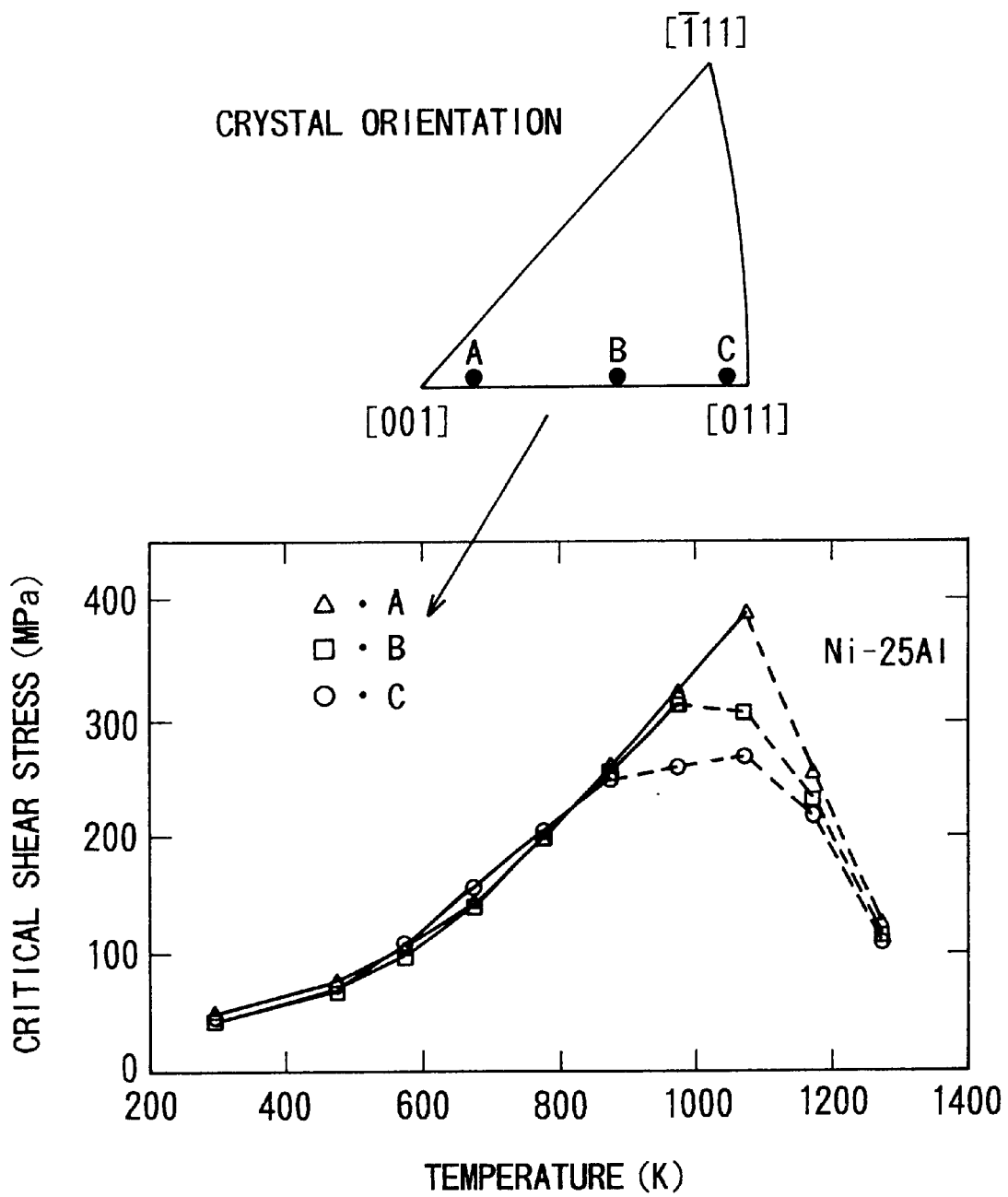
FIG. 1 is a graph showing dependence of strength of $Ni_3Al$ on temperatures.

The invention is described in more detail below.

To begin with, the process for producing the $Ni_3Al$ foil in the invention comprises a first step of arc-melting an alloy having a chemical composition containing Ni as a main component and Al to form a starting rod, a second step of growing the starting rod in columnar crystal form by unidirectional solidification, a third step of cutting the unidirectionally solidified rod by electric discharge machining to form a plate, and a fourth step of cold-rolling the plate at room temperature to form a foil. This process consequently makes it possible to produce the thin Ni$_3$Al foil which has the thickness of 200 microns or less and which is excellent in high-temperature strength, oxidation and corrosion resistances and room-temperature ductility.

The arc-melting in the first step is preferably conducted in an inert gas such as argon or helium. The starting rod formed by this arc-melting is not particularly limited. For unidirectional solidification in the second step, for example, a rod having a diameter of 50 mm or less and a length of 300 mm or less is considered.

The formation of the unidirectionally solidified rod in the second step can preferably be conducted by, for example, a floating zone method in a light image furnace. In this case, an appropriate rate of unidirectional solidification is 25 mm/h or less. When the rate exceeds this value, no uniform unidirectionally solidified rod is obtained.

The production of the unidirectionally solidified rod is quite important in the process of the invention. This is because the unidirectional solidification imparts such a very excellent rolling formability that a yield stress is low and a tensile elongation is 60% or more to the Ni$_3$Al intermetallic compound without adding other alloy elements.

The formation of the plate in the third step is conducted by cutting the unidirectionally solidified rod obtained in the second step through, for example, using electric discharge machining. At this time, the size of the plate is not particularly limited. For smoothly conducting the subsequent fourth step, it is advisable that the thickness is 5 mm or less.

In the fourth step, the cold rolling is conducted at room temperature. The annealing may be conducted, as required, at a temperature of 800° C. (or 1,073 K) or more for 20 minutes or more. Further, the annealing and the cold rolling may be repeated several times. In this repeating cycle, it is advisable that the annealing may be conducted, for example, under a degree of vacuum of higher than 10$^{-3}$ Pa at a temperature of 800° C. (or 1,073 K) or more for 20 minutes or more.

The invention is illustrated more specifically by referring to the following Example.

EXAMPLE

First, an alloy having a chemical composition containing Ni as a main component and 12.8 to 13.6% by weight of Al was arc-melted in a high-purity argon gas to form a starting rod having a diameter of approximately 15 mm and a length of approximately 150 mm (first step).

In this case, additives such as manganese, iron and boron can also be added.

It was identified that this Ni$_3$Al intermetallic compound had a temperature dependence of strength which, unlike ordinary metals, increased in strength with increasing temperatures up to 900 K in each of the crystal orientations a, B and C.

Subsequently, a part of this starting rod was unidirectionally melt-solidified in a light image furnace with halogen lamps as a light source by a floating zone method (second step).

Figure 2:
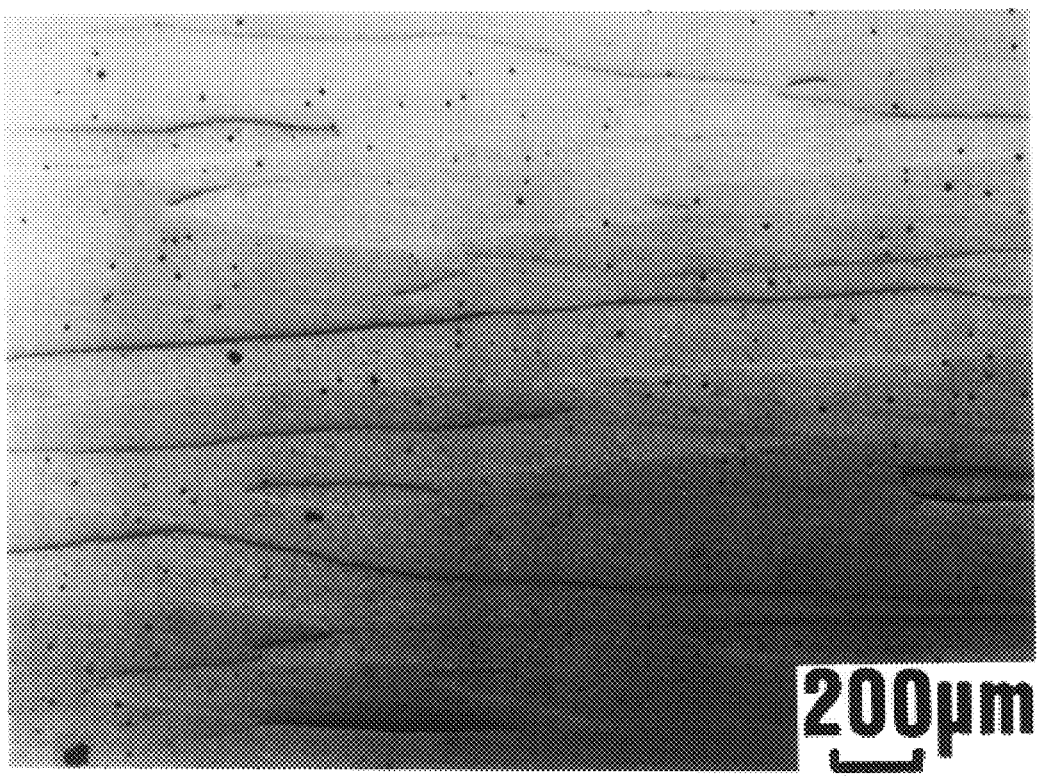
FIG. 2 is an optical micrograph showing a columnar crystal structure of unidirectionally solidified $Ni_3Al$.

In this case, the rate of unidirectional solidification was 25 mm/h or less. Consequently, it was identified, as shown in FIG. 2, that a columnar crystal of Ni$_3$Al in a single phase was developed in a growth direction.

Figure 3:
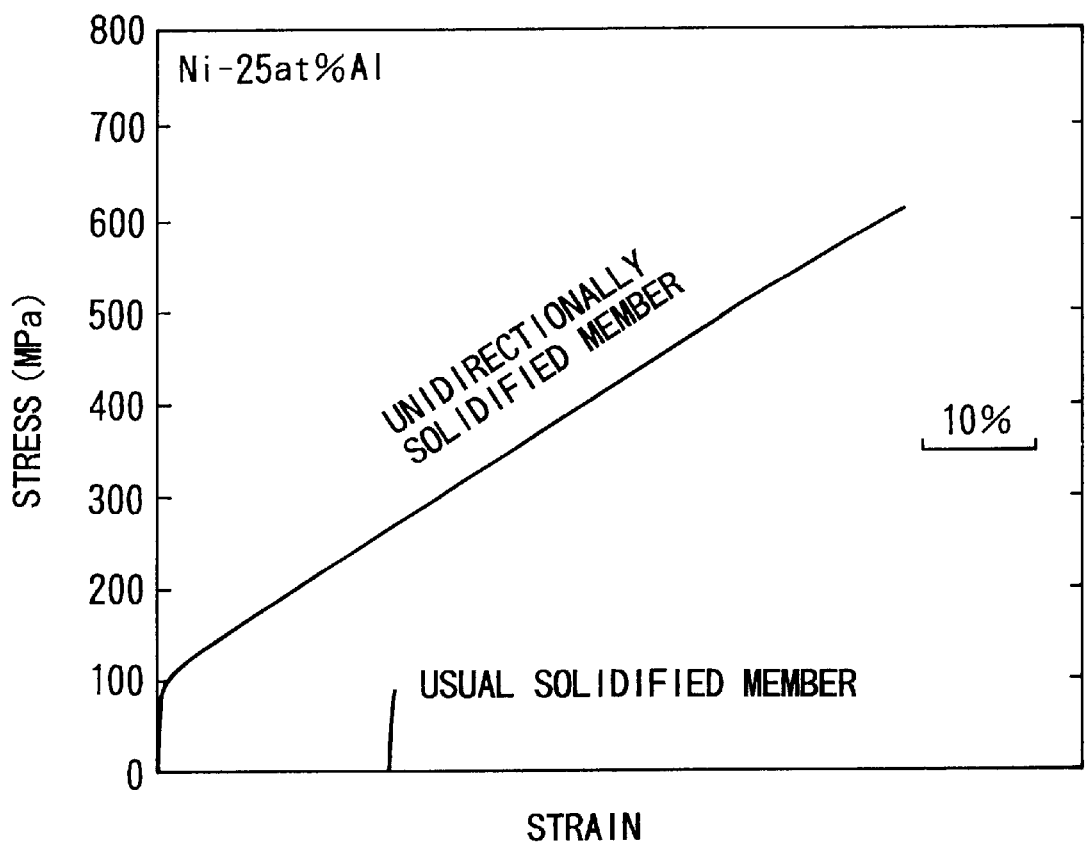
FIG. 3 is a graph showing a tensile stress-strain curve of unidirectionally solidified $Ni_3Al$.

A product having quite a high tensile ductility of 60% or more as shown in FIG. 3 is obtained by controlling the solidification to make uniform the columnar crystal structure.

Subsequently, a part of this starting rod was unidirectionally melt-solidified in a light image furnace with halogen lamps as a light source by a floating zone method (second step).

In this case, the rate of unidirectional solidification was 25 mm/h or less. Consequently, it was identified, as shown in FIG. 2, that a columnar crystal of Ni$_3$Al in a single phase was developed in a growth direction.

A product having quite a high tensile ductility of 60% or more as shown in FIG. 3 is obtained by controlling the solidification to make uniform the columnar crystal structure.

Subsequently, the unidirectionally solidified rod was cut into a plate having a thickness of 1 mm, a width of 7 mm and a length of 70 mm by electric discharge machining (third step), and the plate was then cold-rolled at room temperature (fourth step). In this case, the plate could be rolled into a foil having a thickness of 50 microns with a reduction of 95% without intermediate annealing. In this step, the plate may be annealed, as required, at a temperature of 800° C. (or 1,073 K) or more for 20 minutes or more.

Figure 4:
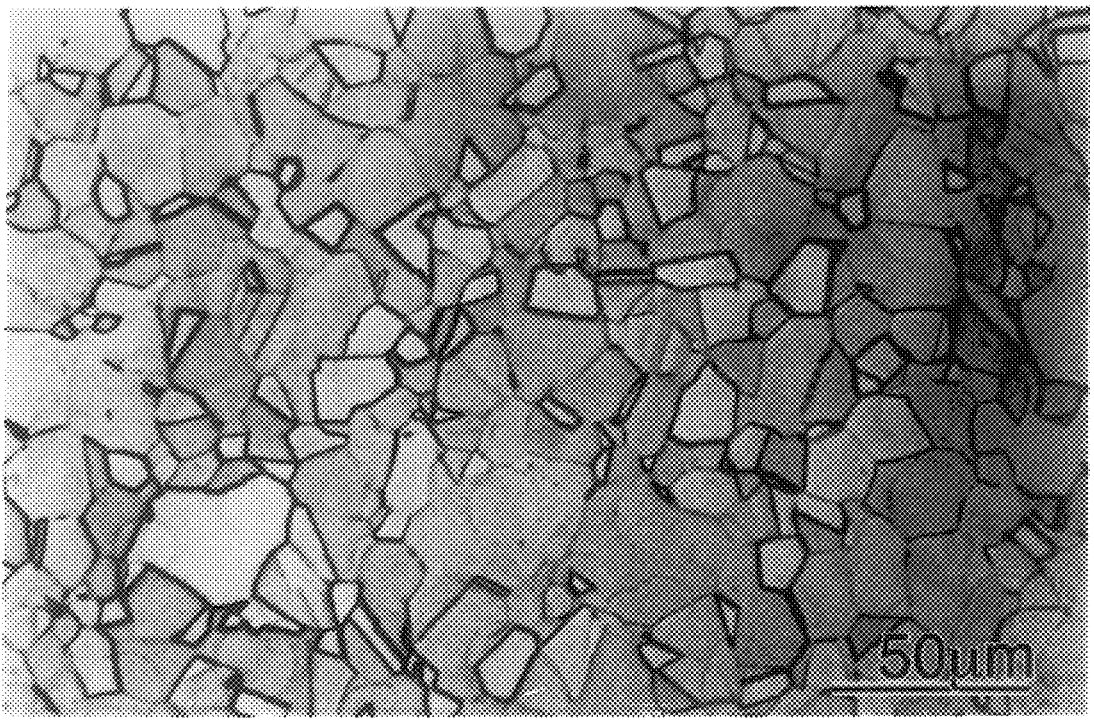
FIG. 4 is an optical micrograph of a recrystalized structure obtained by annealing a cold-rolled foil having a thickness of 70 microns at 1,273 K for 30 minutes.
Figure 5:
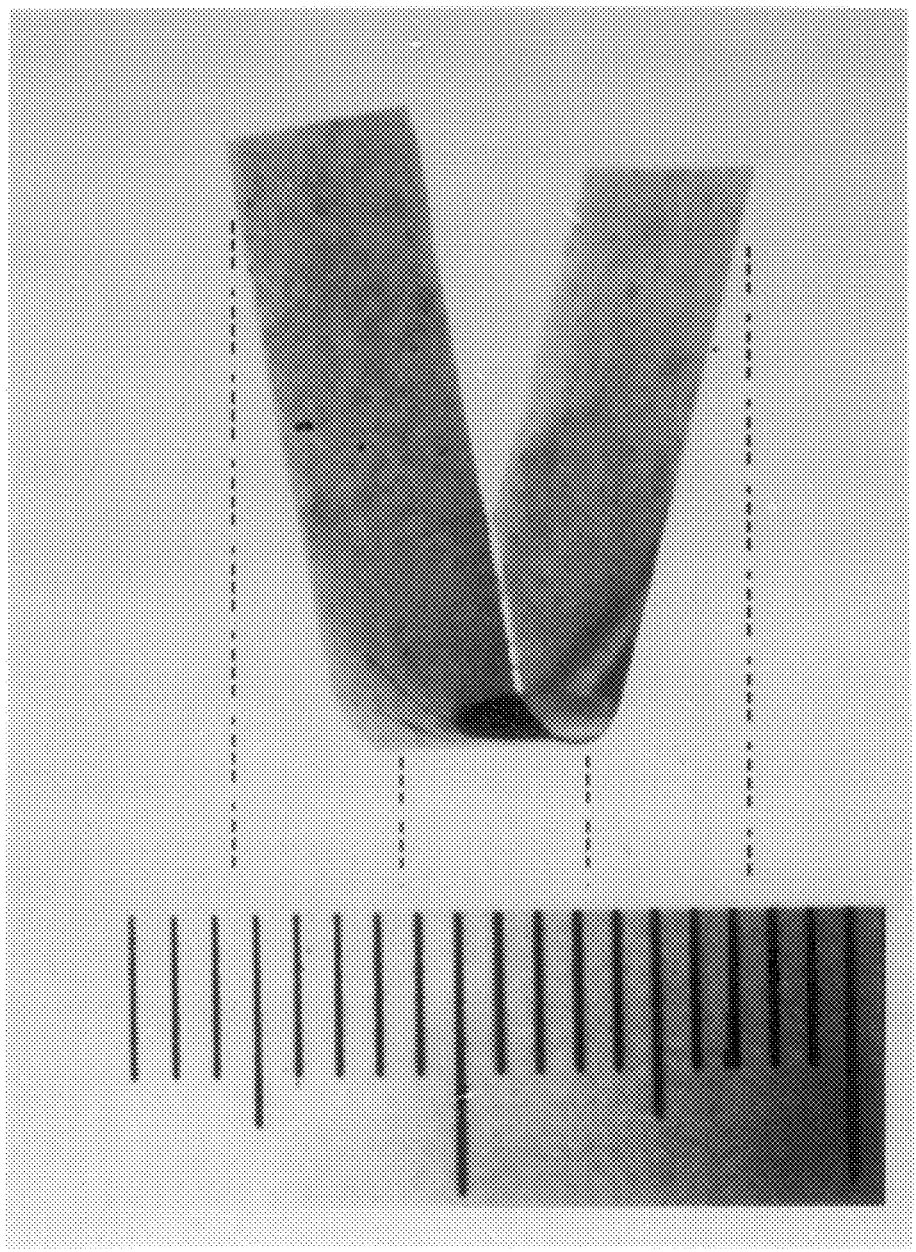
FIG. 5 is a view showing the result of bending test of the recrystallized sample at room temperature.

The cold-rolled foil was work-hardened, and hardly deformed in the next step. However, when the annealing was conducted with a degree of vacuum of higher than 10$^{-3}$ Pa at a temperature of 800° C. (or 1,073 K) or more for 20 minutes or more, even a recrystallized foil having a structure shown in FIG. 4 (recrystallized structure obtained by annealing a cold-rolled foil having a thickness of 70 microns for 30 minutes at 1,273 K), for example, could show a great ductility. When this foil was further cold-rolled (fifth step), a thinner foil could be formed.

Lightweight, heat-resistant structures such as a honeycomb structure and a laminated complex material can be produced by using the foil which is obtained by the process of the invention. The lightweight, heat-resistant structures can be used in power generation turbine, aerospace heat-shielding materials and engine members, and automobile engines.

Further, they are also used in heating elements and shielding materials under strongly corrosive environment by utilizing the oxidation and corrosion resistances, and in various fields.

Such a ductile, heat-resistant foil alone is used in various applications. When it is used in combination with other materials, much more applications are considered.

In this Example, the results of the unidirectional solidification by the floating zone method and the cold rolling are demonstrated. Another process comprising a combination of unidirectional solidification and hot rolling capable of producing Ni$_3$Al columnar crystal can also be included.

According to the invention, the thin foil can be produced from the brittle intermetallic compound by cold rolling, and the characteristics of the intermetallic compound which was hardly put to practical use because of the brittleness can effectively be utilized.

Further such a foil can be used to produce lightweight, heat-resistant structural materials such as a honeycomb structure and a laminated complex material and many other functional materials. Thus, general-purpose materials can be provided.

Moreover, when the lightweight, heat-resistant structures can be produced, the development of high-performance power generation turbines, high-performance jet engines and space vehicles is promoted, and economical effects and effects of global environmental protection such as inhibition of exhaust carbon dioxide gas can be expected.

What is claimed is:

1. A process for producing a heat-resistant intermetallic compound $Ni_3Al$ foil having a room-temperature ductility, which comprises a first step of arc-melting an alloy having a chemical composition containing Ni as a main component and Al to form a starting rod, wherein the alloy in the first step contains Al in an amount of at least 12.8% by weight and at most 13.6% by weight and has an $Ll_2$-type ordered structure, a second step of growing the starting rod in columnar crystal form by unidirectional solidification to form a unidirectionally solidified rod, a third step of cutting out the unidirectionally solidified rod to form a plate, and a fourth step of cold-rolling the plate at room temperature to form a foil.

2. The process for producing the heat-resistant intermetallic compound $Ni_3Al$ foil having the room-temperature ductility as claimed in claim 1, wherein the alloy in the first step contains a third element other than Al.

3. The process for producing the heat-resistant intermetallic compound $Ni_3Al$ foil having the room-temperature ductility as claimed in claim 1, wherein in the first step, a rod having a diameter of 50 mm or less is formed as the starting rod.

4. The process for producing the heat-resistant intermetallic compound $Ni_3Al$ foil having the room-temperature ductility as claimed in claim 1, wherein the rate of unidirectional solidification in the second step is 25 mm/h or less.

5. The process for producing the heat-resistant intermetallic compound $Ni_3Al$ foil having the room-temperature ductility as claimed in claim 1, wherein in the third step, the thickness of the plate is 5 mm or less.

6. The process for producing the heat-resistant intermetallic compound $Ni_3Al$ foil having the room-temperature ductility as claimed in claim 1, wherein in the cold-rolling of the plate in the fourth step, annealing is conducted at a temperature of 800° C. (or 1,073 K) or more for 20 minutes or more.

7. The process for producing the heat-resistant intermetallic compound $Ni_3$ Al foil having the room-temperature ductility as claimed in claim 1, wherein after the fourth step, the foil is annealed with a degree of vacuum of higher than $10^{-3}$ Pa at a temperature of 800° C. (or 1,073 K) or more for 20 minutes or more, and further cold-rolled to form a thinner foil.

* * * * *